United States Patent [19]

Jung

[11] Patent Number: 5,640,338

[45] Date of Patent: Jun. 17, 1997

[54] SEMICONDUCTOR MEMORY DEVICE

[75] Inventor: Chang Ho Jung, Kyoungki-do, Rep. of Korea

[73] Assignee: Hyundai Electronics Industries Co. Ltd., Ichon-Kun, Rep. of Korea

[21] Appl. No.: 568,618

[22] Filed: Dec. 7, 1995

[51] Int. Cl.⁶ .............................. G11C 5/02; G11C 5/06; G11C 8/00

[52] U.S. Cl. .......................... 365/51; 365/63; 365/230.06

[58] Field of Search .................. 365/51, 63, 104, 365/149, 185.23, 230.06

[56] References Cited

U.S. PATENT DOCUMENTS

| | | | |
|---|---|---|---|
| 4,423,492 | 12/1983 | Yoshida | 365/185.23 |
| 4,831,587 | 5/1989 | Taninaka et al. | 365/104 |
| 5,432,116 | 7/1995 | Keum et al. | 437/60 |
| 5,460,996 | 10/1995 | Ryou | 437/52 |
| 5,468,670 | 11/1995 | Ryou | 437/52 |
| 5,519,665 | 5/1996 | Chishiki | 365/230.06 |
| 5,535,153 | 7/1996 | Saeki | 365/51 |
| 5,544,096 | 8/1996 | Takasugi | 365/149 |

Primary Examiner—David C. Nelms
Assistant Examiner—Trong Quang Phan
Attorney, Agent, or Firm—Gary M. Nath; Nath & Associates

[57] ABSTRACT

A semiconductor memory device comprising a plurality of memory cell arrays each of which includes a plurality of memory cells, a plurality of word lines connected to the memory cells for addressing them, a plurality of bit lines connected to the memory cells for transferring data from/to them, a first word line decoder connected to the word lines for activating them, and a bit line decoder connected to the bit lines for activating them. The semiconductor memory device further comprises a plurality of metal lines. Each of the metal lines is formed every four of the word lines and connected to the first word line decoder. The semiconductor memory device further comprises a plurality of second word line decoders. Each of the second word line decoders is connected to a corresponding one of the metal lines to address one of corresponding four of the word lines. The semiconductor memory device further comprises a control signal supply circuit for supplying a plurality of control signals to each of the second word line decoders so that it can address one of the corresponding four word lines.

17 Claims, 5 Drawing Sheets

SEMICONDUCTOR MEMORY DEVICE

BACKGROUND OF THE INVENTION

1. Field of the Invention

The present invention relates in general to semiconductor memory devices such as dynamic random access memories, and more particularly to a semiconductor memory device for preventing a metal bridge from being generated between adjacent metal lines because of an increase in memory capacity.

2. Description of the Prior Art

Referring to FIG. 1, there is shown a circuit diagram illustrating a memory cell array in a conventional semiconductor memory device. As shown in this drawing, a memory cell array block comprises a plurality of word lines 112, a plurality of bit lines and a plurality of memory cells, each of which includes an NMOS transistor and a capacitor.

In FIG. 1, the word lines are connected directly to a decoder 110 and each of them comprises polysilicon. However, the above-mentioned conventional semiconductor memory device has a disadvantage in that data stored in the memory cells cannot rapidly be accessed, particularly in the case where the memory device has a large capacity. In order to overcome such a problem, there has been proposed a method of forming a metal strap at a predetermined distance from each of the word lines as shown in FIG. 2 (Vpp represents the voltage from a high voltage generator). However, the above-mentioned method has a disadvantage in that the metal cannot compete with a tight pitch between adjacent ones of the word lines because chip density is gradually increased according to the design rule of submicron. To solve the problem with the above-mentioned method, there has recently been developed a method of adding sub-decoders to the construction of FIG. 2.

Referring to FIG. 3, there is shown a circuit diagram illustrating a memory cell array in a conventional semiconductor memory device in which sub-decoders are formed. In this construction of FIG. 3, enable and disable metal lines must be provided to allow a main row decoder to enable and disable the sub-decoders. Generally, in a semiconductor memory device employing sub-decoders, one metal line is formed for two word lines. In this case, a pitch between adjacent metal lines becomes narrower due to a high integration degree of the semiconductor memory device, thereby significantly increasing the probability that a metal bridge will be generated in the manufacturing process. Such a metal bridge results in the formation of a short circuit between supply and ground voltage sources, thereby making it impossible to normally operate the semiconductor memory device. Furthermore, it is very hard to repair the semiconductor memory device.

SUMMARY OF THE INVENTION

Therefore, the present invention has been made in view of the above problems, and it is an object of the present invention to provide a semiconductor memory device for removing a defect resulting from a metal bridge between adjacent metal lines and minimizing a row decoding failure resulting from a bridge between adjacent polyword lines.

In accordance with the present invention, the above and other objects can be accomplished by a provision of a semiconductor memory device comprising a plurality of memory cell arrays, each of the memory cell arrays including a plurality of memory cells, each of the memory cells having a transistor and a capacitor, a plurality of word lines connected to the memory cells for addressing them, a plurality of bit lines connected to the memory cells for transferring data from/to them, first word line decoding means connected to the word lines for activating them, and bit line decoding means connected to the bit lines for activating them, wherein the improvement comprises a plurality of metal lines, each of the metal lines being formed every four of the word lines and connected to the first word line decoding means; a plurality of second word line decoding means, each of the second word line decoding means being connected to a corresponding one of the metal lines to address one of corresponding four of the word lines; and control signal supply means for supplying a plurality of control signals to each of the second word line decoding means so that it can address one of the corresponding four word lines.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
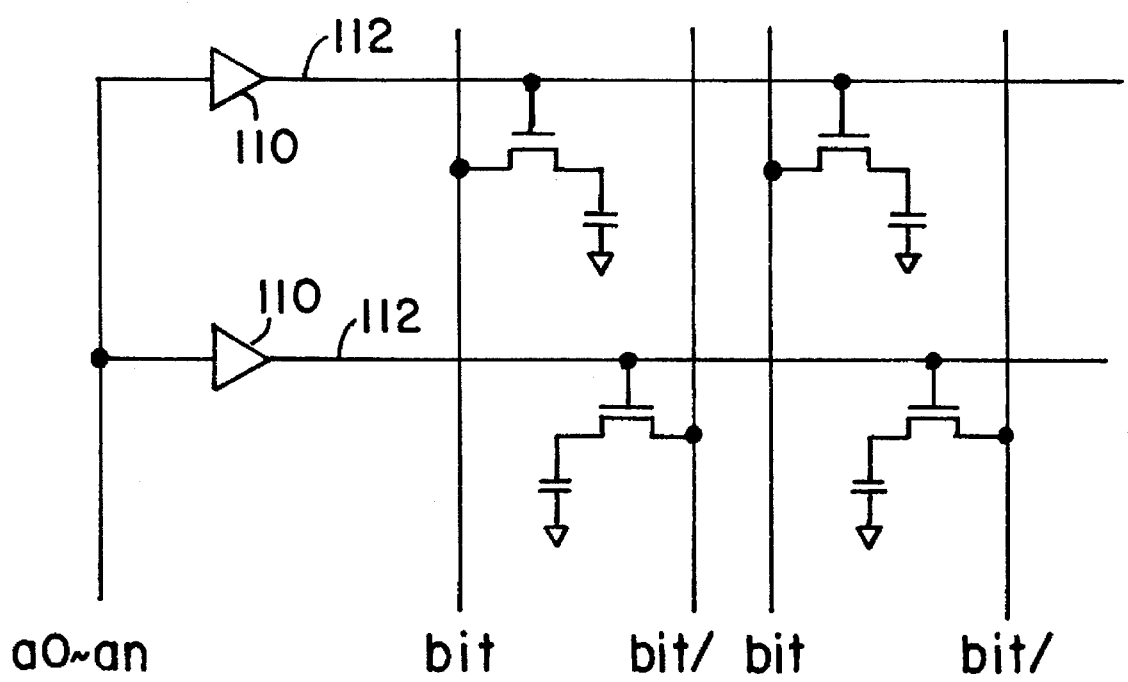
FIG. 1 is a circuit diagram illustrating a basic memory cell array in a conventional semiconductor memory device.
Figure 2:
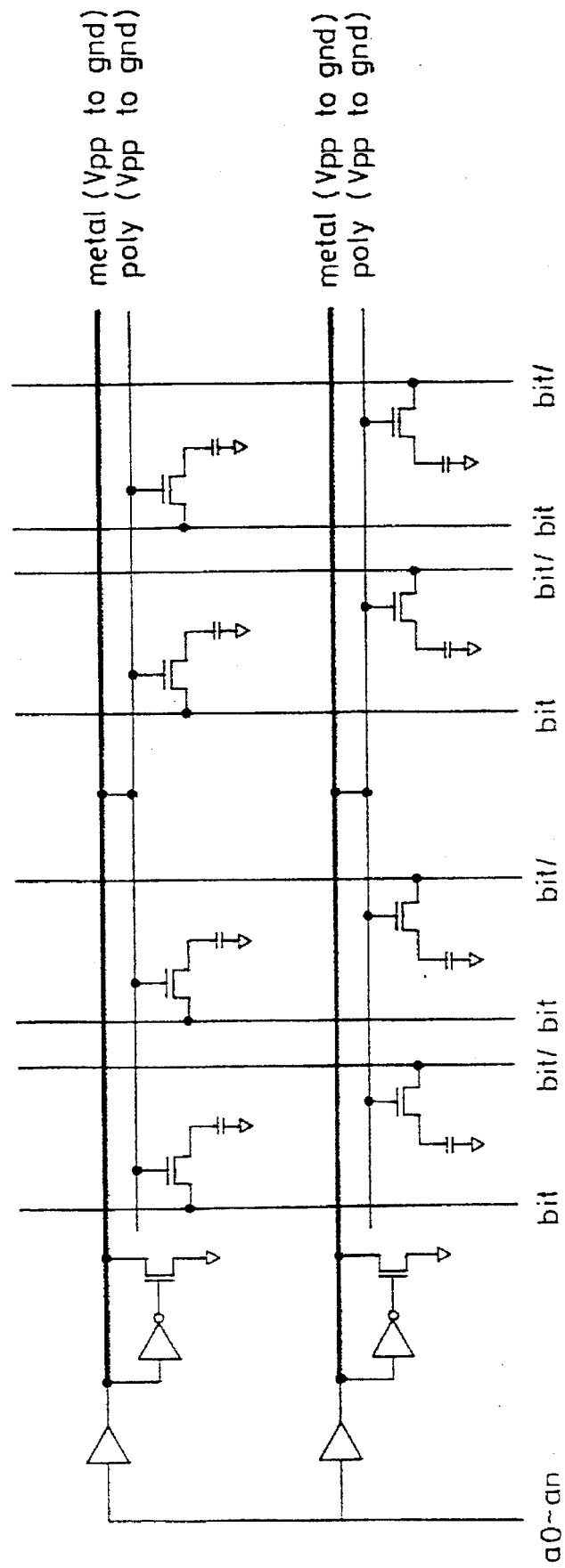
FIG. 2 is a circuit diagram illustrating a memory cell array in a conventional semiconductor memory device in which metal straps are formed.
Figure 3:
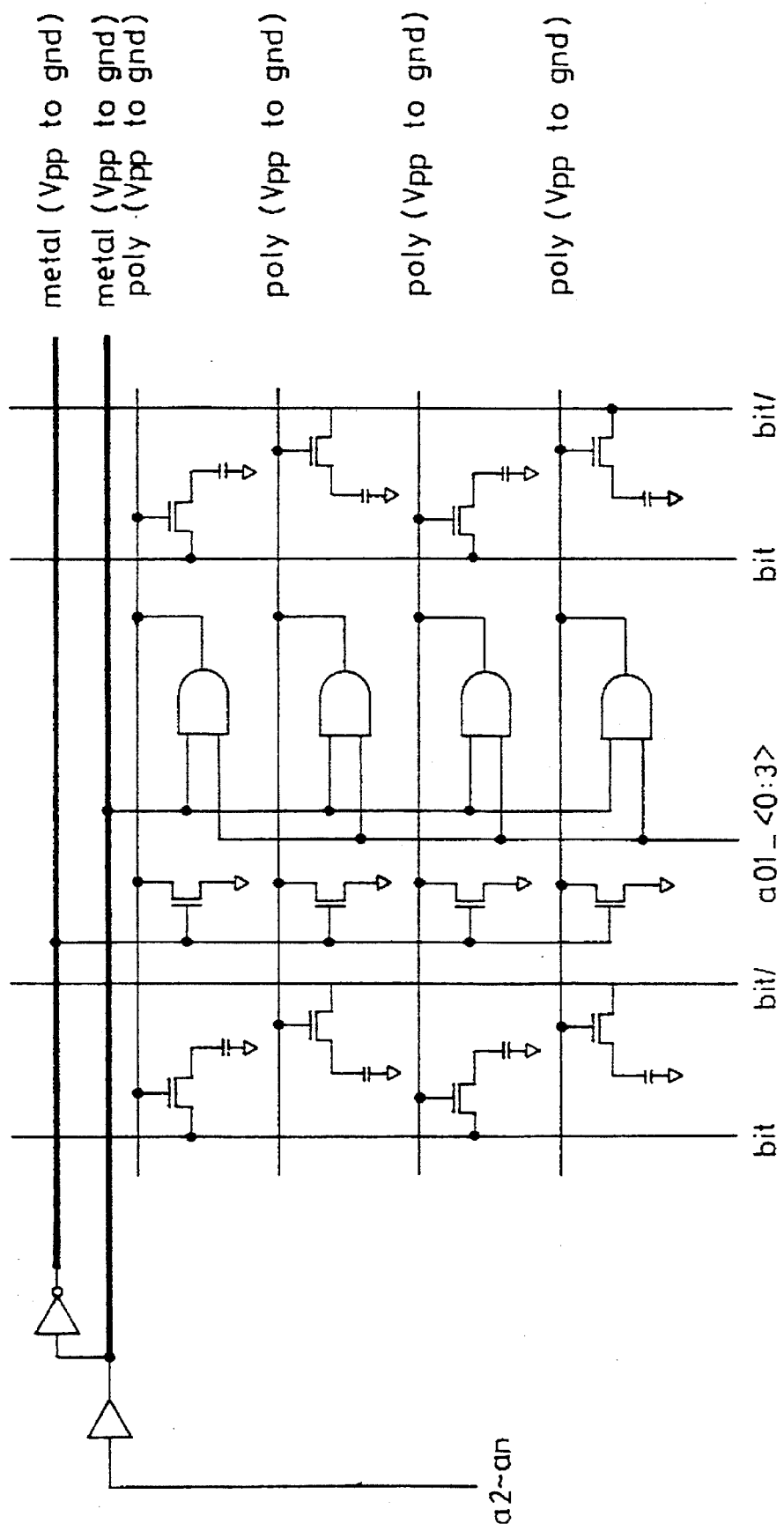
FIG. 3 is a circuit diagram illustrating a memory cell array in a conventional semiconductor memory device in which sub-decoders are formed.
Figure 4:
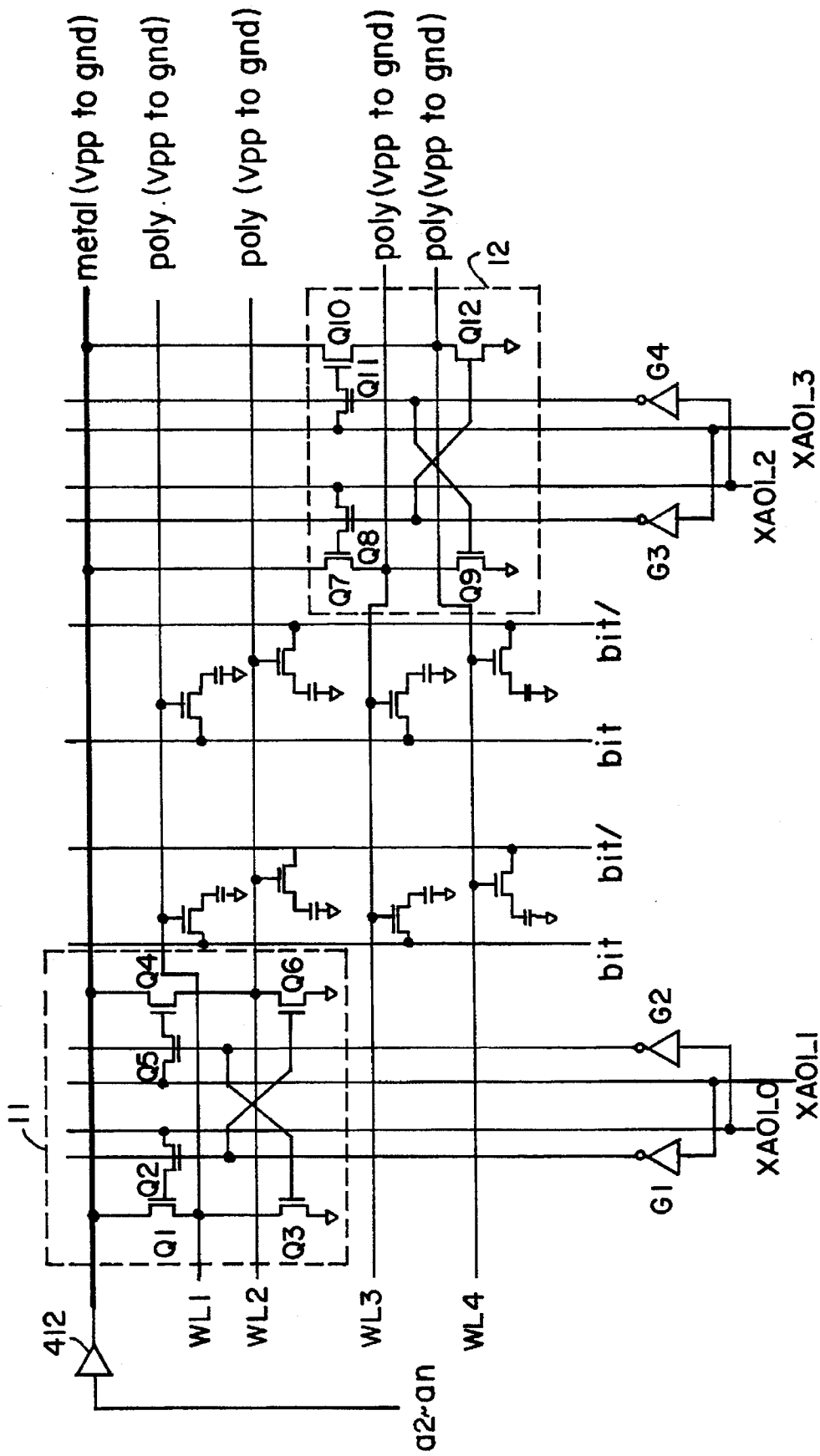
FIG. 4 is a circuit diagram of a semiconductor memory device in accordance with an embodiment of the present invention.

Referring to FIG. 4, there is shown a circuit diagram of a semiconductor memory device in accordance with an embodiment of the present invention. As shown in this drawing, a metal line, generally used to reduce propagation delay time of word lines, is formed every four of the word lines to increase a pitch between adjacent metal lines. The metal line is connected directly to an output terminal of a global row decoder 412. First and second sub-decoder blocks 11 and 12 are formed between the metal line and the four word lines. The word lines each comprise polysilicon, and will hereinafter be referred to as polyword lines.

The first sub-decoder block 11 acts to select one of the first and second polyword lines WL1 and WL2. The second sub-decoder block 12 acts to select one of the third and fourth polyword lines WL3 and WL4.

The first sub-decoder block 11 includes an NMOS transistor Q1 connected between the metal line and the first polyword line WL1, an NMOS transistor Q2 connected between a gate of the NMOS transistor Q1 and a first address line XA01_0, an NMOS transistor Q4 connected between the metal line and the second polyword line WL2, and NMOS transistor Q5 connected between a gate of the NMOS transistor Q4 and a second address line XA01_1, an NMOS transistor Q3 connected between the first polyword line WL1 and a ground voltage source Vss, and an NMOS transistor Q6 connected between the second polyword line WL2 and the ground voltage source Vss. The NMOS transistor Q2 has its gate connected to the second address line XA01_1, and the NMOS transistor Q5 has its gate connected to the first address line XA01_0. The NMOS transistor Q3 has its gate connected to the first address line XA01_0, and the NMOS transistor Q6 has its gate connected to the second address line XA01_1. An inverter G1 is connected between the second address line XA01_1 and the gates of the NMOS transistors Q2 and Q6. An inverter G2 is connected between the first address line XA01_0 and the gates of the NMOS transistors Q3 and Q5.

The second sub-decoder block 12 includes an NMOS transistor Q7 connected between the metal line and the third polyword line WL3, an NMOS transistor Q8 connected between a gate of the NMOS transistor Q7 and a third address line XA01_2, and NMOS transistor Q10 connected between the metal line and the fourth polyword line WL4, an NMOS transistor Q11 connected between a gate of the NMOS transistor Q10 and fourth address line XA01_3, an NMOS transistor Q9 connected between the third polyword line WL3 and the ground voltage source Vss, and an NMOS transistor Q12 connected between the fourth polyword line WL4 and the ground voltage source Vss. The NMOS transistor Q8 has its gate connected to the fourth address line XA01_3, and the NMOS transistor Q11 has its gate connected to the third address line XA01_2. The NMOS transistor Q9 has its gate connected to the third address line XA01_2, and the NMOS transistor Q12 has its gate connected to the fourth address line XA01_3. An inverter G3 is connected between the fourth address line XA01_3 and the gates of the NMOS transistors Q8 and Q12. An inverter G4 is connected between the third address line XA01_2 and the gates of the NMOS transistors Q9 and Q11.

The operation of the semiconductor memory device with the above-mentioned construction in accordance with the embodiment of the present invention will hereinafter be described in detail with reference to FIG. 4. The description will be made particularly with respect to the operations of the first and second sub-decoder blocks 11 and 12 which address one of the four polyword lines WL1–WL4.

First, the metal line connected to the output terminal of the global row decoder is activated in response to an address signal therefrom. Under this condition, the first and second sub-decoder blocks 11 and 12 select one of the four polyword lines WL1–WL4 in response to signals on the four address lines XA01_0–XA01_3.

When the first address line XA01_0 is high in logic, the second address line XA01_1 is low in logic, the third address line XA01_2 is low in logic and the fourth address line XA01_3 is low in logic, the NMOS transistors Q1 and Q2 are turned on, whereas the NMOS transistors Q3, Q4, Q5, Q7, Q8, Q10 and Q11 are turned off. As a result, the first polyword lines WL1 is selected. In this case, the NMOS transistors Q6, Q9 nd Q12 are turned on to prevent the second to fourth polyword lines WL2–WL4 from floating.

In the case where the first address line XA01_0 is low in logic, the second address line XA01_1 is high in logic, the third address line XA01_2 is low in logic and the fourth address line XA01_3 is low in logic, the NMOS transistors Q4 and Q5 are turned on, whereas the NMOS transistors Q1, Q2, Q6, Q7, Q8, Q10 and Q11 are turned off. As a result, the second polyword lines WL2 is selected. In this case, the NMOS transistors Q3, Q9 and Q12 are turned on to prevent the first, third and fourth polyword lines WL1, WL3 and WL4 from floating.

When the first address line XA01_0 is low in logic, the second address line XA01_1 is low in logic, the third address line XA01_2 is high in logic and the fourth address line XA01_3 is low in logic, the NMOS transistors Q7 and Q8 are turned on, whereas the NMOS transistors Q1, Q2, Q4, Q5, Q9, Q10 and Q11 are turned off. As a result, the third polyword line WL3 is selected. In this case, the NMOS transistors Q3, Q6 and Q12 are turned on to prevent the first, second and fourth polyword lines WL1, WL2 and WL4 from floating.

When the first address line XA01_0 is low in logic, the second address line XA01_1 is low in logic, the third adress line XA01_2 is low in logic and the fourth address line XA01_3 is high in logic, the NMOs transistors Q10 and Q11 are turned on, whereas the NMOS transistors Q1, Q2, Q4, Q5, Q7, Q8 and Q12 are turned off. As a result, the fourth polyword line WL4 is selected. In this case, the NMOS transistors Q3, Q6 and Q9 are turned on to prevent the first to third polyword lines WL1–WL3 from floating.

Finally, in the case where the first to fourth address lines XA01_0–XA01_3 are all low logic, the NMOS transistors Q1, Q2, Q4, Q5, Q7, Q8, Q10 and Q12 are turned off. As a result, any polyword line is not selected.

Figure 5:
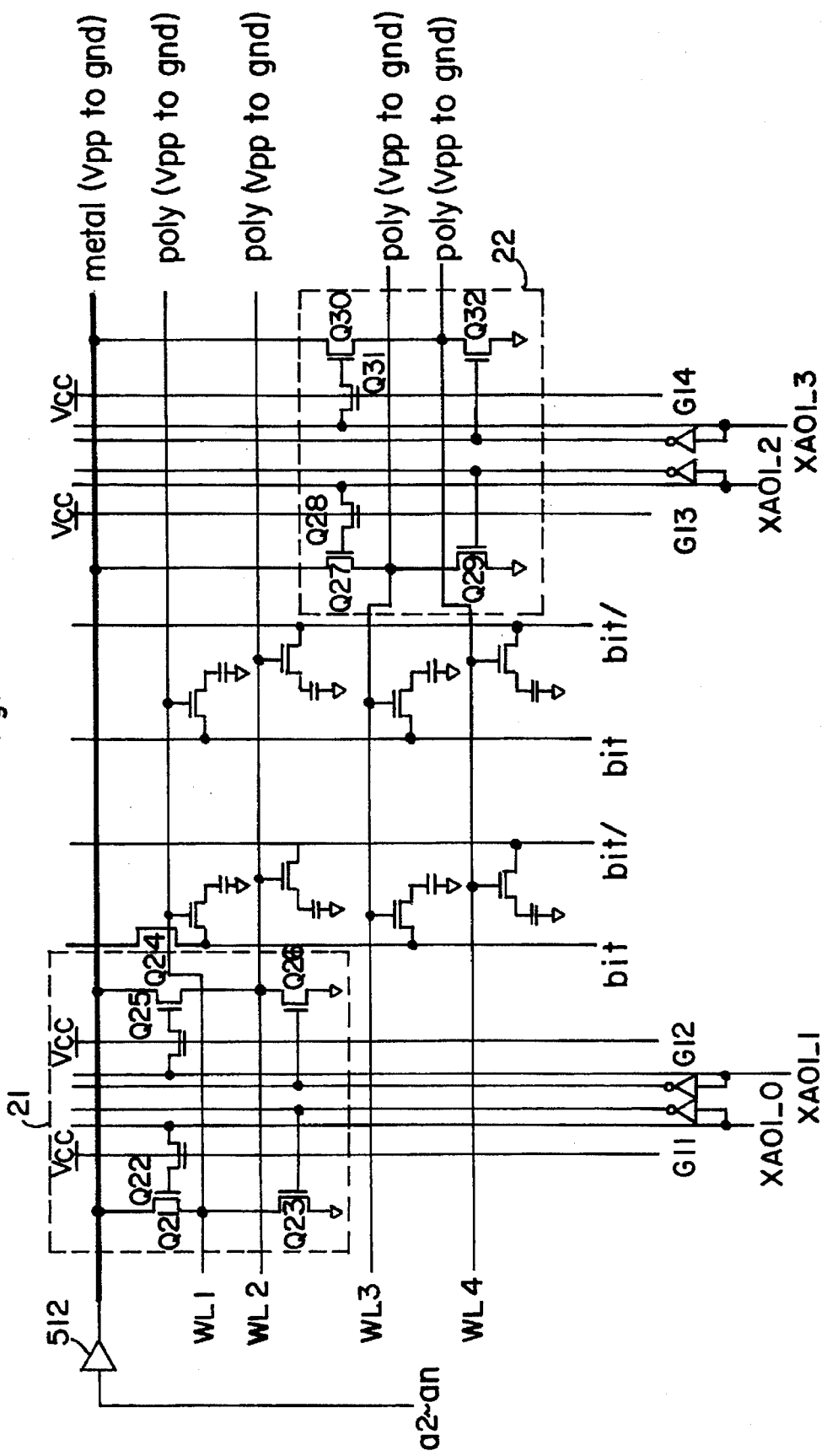
FIG. 5 is a circuit diagram of a semiconductor memory device in accordance with an alternative embodiment of the present invention.

Referring to FIG. 5, there is shown a circuit diagram of a semiconductor memory device in accordance with an alternative embodiment of the present invention. This embodiment can be applied to the case where a sub-decoder block has a space in which a supply voltage line Vcc can be formed.

In a similar manner to the first embodiment in FIG. 4, in the second embodiment as shown in FIG. 5, a metal line is formed every four word lines to increase a pitch between adjacent metal lines. First and second sub-decoder blocks 21 and 22 are formed between the metal line and the four word lines to address one of the word lines.

In FIG. 5, the first sub-decoder block 21 includes an NMOS transistor Q21 connected between the metal line and the first polyword line WL1, an NMOS transistor Q22 connected between a gate of the NMOS transistor Q21 and a first address line XA01_0, an NMOS transistor Q24 connected between the metal line and the second polyword line WL2, an NMOS transistor Q25 connected between a gate of the NMOS transistor Q24 and a second address line XA01_1, an NMOS transistor Q23 connected between the first polyword line WL1 and a ground voltage source Vss, and an NMOS transistor Q26 connected between the second polyword line WL2 and the ground voltage source Vss. The NMOS transistors Q22 and Q25 have their gates connected to a supply voltage source Vcc. The NMOS transistor Q23 has its gate connected to the first address line XA01_0, and the NMOS transistor Q26 has its gate connected to the second address line XA01_1. An inverter G11 is connected between the first address line XA01_0 and the gate of the NMOS transistor Q23. An inverter G12 is connected between the second address line XA01_1 and the gate of the NMOS transistor Q26.

The second sub-decoder block 22 includes an NMOS transistor Q27 connected between the metal line and the third polyword line WL3, an NMOS transistor Q28 connected between a gate of the NMOS transistor Q27 and a third address line XA01_2, an NMOS transistor Q30 connected between the metal line and the fourth polyword line WL4, an NMOS transistor Q31 connected between a gate of the NMOS transistor Q30 and a fourth address line XA01_3, an NMOS transistor Q29 connected between the third polyword line WL3 and the ground voltage source Vss, and an NMOS transistor Q32 connected between the fourth polyword line WL4 and the ground voltage source Vss. The NMOS transistors Q28 and Q31 have their gates connected to the supply voltage source Vcc. The NMOS transistor Q29 has its gate connected to the third address line XA01_2, and the NMOS transistor Q32 has its gate connected to the fourth address line XA01_3. An inverter G13 is connected between the third address line XA01_2 and the gate of the NMOS transistor Q29. An inverter G14 is connected between the fourth address line XA01_3 and the gate of the NMOS transistor Q32.

The operation of the semiconductor memory device with the above-mentioned construction in accordance with the alternative embodiment of the present invention will hereinafter be described in detail with reference to FIG. 5. The description will be made particularly with respect to the operations of the first and second sub-decoder blocks 21 and 22 which address one of the four polyword lines WL1–WL4.

First, the metal line is activated in response to an address signal from the output terminal of the global row decoder 512. Under this condition, the first and second sub-decoder blocks 21 and 22 select one of the four polyword lines WL1–WL4 in response to signals on the four address lines XA01_0–XA01_3.

When the first address line XA01_0 is high in logic, the second address line XA01_1 is low in logic, the third address line XA01_2 is low in logic and the fourth address line XA01_3 is low in logic, the NMOS transistors Q21 and Q22 are turned on, whereas the NMOS transistors Q23, Q24, Q25, Q27, Q28, Q30 and Q31 are turned off. As a result, the first polyword line WL1 is selected. In this case, the NMOS transistors Q26, Q29 and Q32 are turned on to prevent the second to fourth polyword lines WL2–WL4 from floating.

In the case where the first address line XA01_0 is low in logic, the second address line XA01_1 is high in logic, the third address line XA01_2 is low in logic and the fourth address line XA01_3 is low in logic, the NMOS transistors Q24 and Q25 are turned on, whereas the NMOS transistors Q21, Q22, Q26, Q27, Q28, Q30 and Q31 are turned off. As a result, the second polyword line WL2 is selected. In this case, the NMOS transistors Q23, Q29 and Q32 are turned on to prevent the first, third and fourth polyword lines WL1, WL3 and WL4 from floating.

When the first address line XA01_0 is low in logic, the second address line XA01_1 is low in logic, the third address line XA01_2 is high in logic and the fourth address line XA01_3 is low in logic, the NMOS transistors Q27 and Q28 are turned on, whereas the NMOS transistors Q21, Q22, Q24, Q25, Q29, Q30 and Q31 are turned off. As a result, the third polyword line WL3 is selected. In this case, the NMOS transistors Q23, Q26 and Q32 are turned on to prevent the first, second and fourth polyword lines WL1, WL2 and WL4 from floating.

When the first address line XA01_0 is low in logic, the second address line XA01_1 is low in logic, the third address line XA01_2 is low in logic and the fourth address line XA01_3 is high in logic, the NMOS transistors Q30 and Q31 are turned on, whereas the NMOS transistors Q21, Q22, Q24, Q25, Q27, Q28 and Q32 are turned off. As a result, the fourth polyword line WL4 is selected. In this case, the NMOS transistors Q23, Q26 and Q29 are turned on to prevent the first to third polyword lines WL1–WL3 from floating.

Finally, in the case where the first to fourth address lines XA01_0–XA01_3 are all low in logic, the NMOS transistors Q21, Q22, Q24, Q25, Q27, Q28, Q30 and Q32 are turned off. As a result, no polyword line is selected.

As apparent from the above description, according to the present invention, the metal line connected to the output terminal of the global row decoder is formed every four word lines, thereby significantly reducing the metal bridge production probability as compared with the conventional construction. Although the metal bridge has been produced, it will have no bad effect on any address lines other than the corresponding address line. Further, a failure resulting from a bridge between adjacent polyword lines can readily be repaired by controlling the signals on the address lines or the address signal from the global row decoder. The present invention can be used to address word lines of DRAM and other high-density memory devices such as SRAM, VRAM, etc.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor memory device comprising:
   plurality of memory cells, each of said memory cells having a transistor and a capacitor;
   a plurality of word lines connected to said memory cells for addressing said memory cells, a plurality of bit lines connected to said memory cells for transferring data from/to them;
   a plurality of metal lines, each of said metal lines being formed every four of said word lines and connected in common to said four word lines; and
   a plurality of word line decoding means, each of said word line decoding means being connected to a corresponding one of said metal lines to address one of corresponding four of said word lines, each of said word line decoding means including a plurality of first transistors and a plurality of second transistors, each of said second transistors being connected between said corresponding metal lines and a corresponding one of said corresponding four word lines to select the corresponding word line under control of a corresponding one of said first transistors.

2. A semiconductor memory device as set forth in claim 1, wherein each of said word line decoding means further includes a plurality of third transistors, each of said third transistors being connected between a corresponding one of said corresponding four word lines and a ground voltage source to prevent the corresponding word line from floating when it is not selected by a corresponding one of said second transistors.

3. A semiconductor memory device as set forth in claim 1, wherein each of said first transistors has its gate connected to a supply voltage source.

4. A semiconductor memory device comprising:
   a plurality of memory cells, each of said memory cells having a transistor and a capacitor;
   a plurality of word lines connected to said memory cells for addressing said memory cells, a plurality of bit lines connected to said memory cells for transferring data from/to them;
   a plurality of metal lines, each of said metal lines being formed every four of said word lines and connected in common to said four word lines;
   a plurality of word line decoding means, each of said word line decoding means being connected to a corresponding one of said metal lines to address one of corresponding four of said word lines, each of said word line decoding means including a plurality of first transistors, each of said first transistors being driven in response to a corresponding one of the control signals from said control signal supply means, and a plurality of second transistors, each of said second transistors being connected between said corresponding metal line and a corresponding one of said corresponding four word lines to select the corresponding word line under control of a corresponding one of said first transistors; and control signal supply means for supplying a plurality of control signals to each of said word line decoding means so that it can address on of said corresponding four word lines.

5. A semiconductor memory device as set forth in claim 4, wherein said control signal supply means includes a plurality of address lines, each of said address lines supplying a corresponding one of the control signals to each of said word line decoding means.

6. A semiconductor memory device as set forth in claim 5, wherein said control signal supply means includes a plurality of address lines, each of said address lines supplying a corresponding one of the control signals to each of said word line decoding means.

7. A semiconductor memory device as set forth in claim 4, wherein each of said word line decoding means further includes a plurality of third transistors, each of said third transistors being connected between a corresponding one of said corresponding four word lines and a ground voltage source and having its gate for inputting a corresponding one of the control signals from said control signal supply means, to prevent the corresponding word line from floating when it is not selected by a corresponding one of said second transistors.

8. A semiconductor memory device as set forth in claim 4, wherein each of said first transistors has its gate connected to a supply voltage source.

9. A semiconductor memory device as set forth in claim 4, wherein said control signal supply means includes a plurality of address lines, each of said address lines supplying a corresponding one of the control signals to each of said word line decoding means.

10. A semiconductor memory device as set forth in claim 4, wherein said control signal supply means includes a plurality of address lines, each of said address lines supplying a corresponding one of the control signals to each of said word line decoding means.

11. A semiconductor memory device as set forth in claim 7, wherein said control signal supply means includes a plurality of address lines, each of said address lines supplying a corresponding one of the control signals to each of said word line decoding means.

12. A semiconductor memory device as set forth in claim 4, wherein each of the control signals from said control signal supply means comprises two least significant bits.

13. A semiconductor memory device as set forth in claim 4, wherein each of the control signals from said control signal supply means comprises two least significant bits.

14. A semiconductor memory device as set forth in claim 7, wherein each of the control signals from said control signal supply means comprises two least significant bits.

15. A semiconductor memory device as set forth in claim 8, wherein each of the control signals from said control signal supply means comprises two least significant bits.

16. A semiconductor memory device as set forth in claim 9, wherein each of the control signals from said control signal supply means comprises two least significant bits.

17. A semiconductor memory device as set forth in claim 10, wherein each of the control signals from said control signal supply means comprises two least significant bits.

* * * * *